(12) United States Patent
Yasuno

(10) Patent No.: US 6,700,057 B2
(45) Date of Patent: Mar. 2, 2004

(54) PHOTOVOLTAIC DEVICE

(75) Inventor: Atsushi Yasuno, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/178,368

(22) Filed: Jun. 25, 2002

(65) Prior Publication Data

US 2003/0015234 A1 Jan. 23, 2003

(30) Foreign Application Priority Data

Jun. 29, 2001 (JP) ........................................ 2001-200155

(51) Int. Cl.[7] ................ H01L 31/078; H01L 31/04
(52) U.S. Cl. ................. 136/258; 136/249; 136/255; 136/261; 257/463; 257/461; 257/458
(58) Field of Search .................. 136/258, 249, 136/255, 261; 257/463, 461, 458

(56) References Cited

U.S. PATENT DOCUMENTS

| | | | |
|---|---|---|---|
| 2,949,498 A | | 8/1960 | Jackson ........................ 136/244 |
| 4,531,015 A | * | 7/1985 | Wong et al. .................. 136/258 |
| 4,776,894 A | * | 10/1988 | Watanabe et al. ............ 136/249 |
| 4,926,230 A | * | 5/1990 | Yamagishi et al. .......... 136/249 |
| 6,350,489 B1 | * | 2/2002 | Moriyama et al. ........ 427/255.5 |
| 2003/0006218 A1 | * | 1/2003 | Yasuno et al. ............ 219/121.59 |

FOREIGN PATENT DOCUMENTS

JP       7-94768 A   *   4/1995

OTHER PUBLICATIONS

S. Guha, J. Yang, P. Nath, and M. Hack, "Enhancement of open circuit voltage in high efficiency amorphous silicon alloy solar cells" Applied Physics Letters, 49 (4), 1986, p. 218.

* cited by examiner

*Primary Examiner*—Alan Diamond
(74) *Attorney, Agent, or Firm*—Fitzpatrick, Cella, Harper & Scinto

(57) ABSTRACT

The present invention provides a photovoltaic device comprising an electricity generating layer including at least one p/n type junction, the layer comprising a silicon-based non-single-crystalline semiconductor material, wherein a nitrogen concentration has a maximum peak at the junction interface of the p/n type junction, and the nitrogen concentration at the maximum peak is within a range from $1 \times 10^{18}$ atom/cm$^3$ to $1 \times 10^{20}$ atom/cm$^3$, thereby providing a photovoltaic device of high photoelectric conversion efficiency and high reliability.

10 Claims, 6 Drawing Sheets

PHOTOVOLTAIC DEVICE

BACKGROUND OF THE INVENTION

1. Field of the Invention

The present invention relates to a photovoltaic device composed of a silicon-based non-single-crystal semiconductor material, and more particularly to a photovoltaic device having a high photoelectric conversion efficiency and high reliability.

2. Related Background Art

The photovoltaic device is a semiconductor device for converting optical energy such as solar light into electric energy. As the semiconductor material therefor, amorphous materials represented by amorphous silicon (a-Si:H) is attracting attention and is being intensively investigated because such materials are inexpensive, and enable preparation in a large area and in a thin film, a large freedom in composition and control of the electrical and optical characteristics over a wide range.

In the photovoltaic device composed of the above-mentioned amorphous material, an improvement in the photoelectric conversion efficiency is an important requirement.

As a method for meeting such requirement, the U.S. Pat. No. 2,949,498 proposes the use of so-called tandem cell formed by stacking a plurality of solar cells of a unit element structure. Such tandem cell is to improve the conversion efficiency by stacking the elements of different band gaps and efficiently absorbing the different portions of the spectrum of solar light. Such cell is so designed that, in comparison with the band gap of so-called top layer positioned at the light incident side of the stacked elements, the band gap of so-called bottom layer positioned under such top layer is narrower. There is also investigated a three-layer tandem cell (hereinafter, referred to as "triple cell") having so-called middle layer between the aforementioned top and bottom layers.

Also there is often adopted a configuration having a p-layer at the transparent electrode side, namely at the light incident side in order to facilitate collection of the positive holes having a shorter diffusion distance within the electron-positive hole pairs generated from the incident light, thereby improving the total light conversion efficiency, and also having a substantially intrinsic semiconductor (hereinafter represented as "i-type layer") between the p-layer and an n-layer.

Also there can be achieved an improvement in the short circuit current (Jsc) by employing microcrystalline silicon in the p-layer at the light incident side, utilizing the high conductivity and the low absorption coefficient at the short wavelength region of microcrystalline silicon. Further, microcrystalline silicon, having a wider band gap in comparison with amorphous silicon, shows a higher efficiency for the addition of impurities and increases the internal electric field in the photovoltaic device. As a result, there are reported improvements in the open circuit voltage (Voc) and the photoelectric conversion efficiency ("Enhancement of open circuit voltage in high efficiency amorphous silicon alloy solar cells" S. Guha, J. Yang, P. Nath and M. Hack: Appl. Phys. Lett., 49 (1986) 218).

In such photovoltaic devices, however, it is difficult to stably control the interfacial characteristics of the junction portion of the p- and n-layers, and the fluctuation in the junction state and the amount of impurities causes an increase in the serial resistance and a deterioration in the IV characteristics resulting therefrom, thereby leading to variations in the characteristics.

SUMMARY OF THE INVENTION

In consideration of the foregoing, the object of the present invention is to provide a photovoltaic device capable of stabilizing the control of the interface of the junction portion between the p- and n-layers and improving the interface characteristics, thereby achieving a high photoelectric conversion efficiency.

A photovoltaic device of the present invention is a photovoltaic device comprising a plurality of unit elements stacked mutually while forming p/n type junction, each of the unit elements having a pn or pin structure composed of a silicon-based non-single-crystal semiconductor material, wherein the nitrogen concentration has a maximum peak at the junction interface of the aforementioned p/n type junction, and the nitrogen concentration at the maximum peak (hereinafter, referred to as "peak nitrogen concentration") is within a range from $1 \times 10^{18}$ to $1 \times 10^{20}$ atom/cm$^3$.

DESCRIPTION OF THE PREFERRED EMBODIMENTS

Now the present invention will be described in detail with reference to the accompanying drawings, but the photovoltaic device of the present invention is by no means limited by such description.

Figure 1:
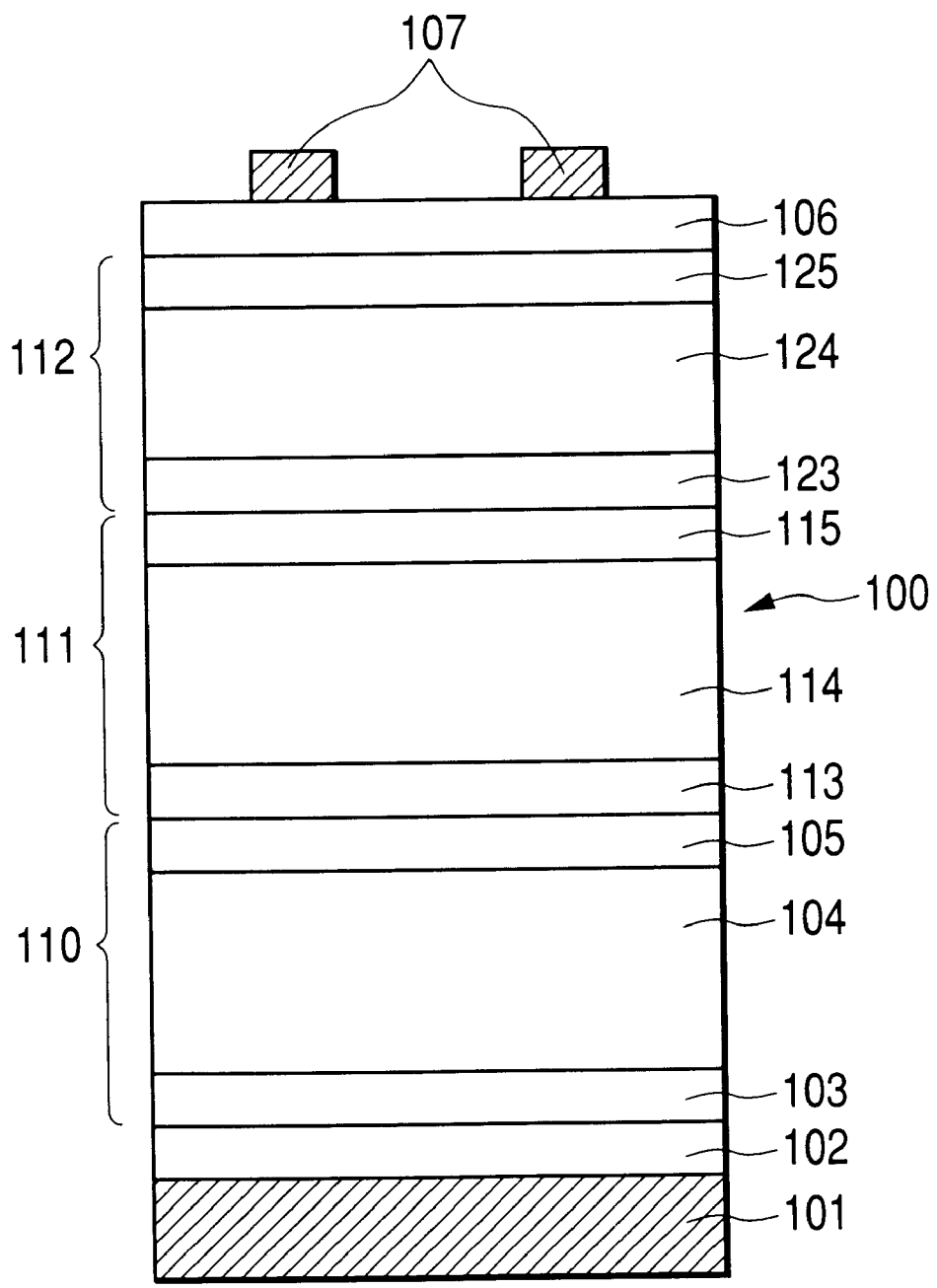
FIG. 1 is a schematic view showing the configuration of a photovoltaic device of the present invention.

FIG. 1 is a schematic view of a pin type amorphous solar cell suitable for the application of the photovoltaic device of the present invention. FIG. 1 shows a solar cell of a configuration in which the light enters from the upper part of the drawing, wherein there are shown a solar cell 100 itself, a bottom layer 110, a middle layer 111, a top layer 112, a base member 101, a lower electrode 102, n-type semiconductor layers 103, 113, 123, i-type semiconductor layers 104, 114, 124, p-type semiconductor layers 105, 115, 125, an upper electrode 106 and a current-collecting electrode 107.

(Base Member)

The semiconductor layers, which are as thin as about 1 μm, are deposited on a suitable base member serving as a support member. Such base member 101 can be single-crystalline or non-single-crystalline, or electrically conductive or insulating. It can further be translucent or opaque, but preferably shows little deformation or distortion and has a desired strength.

Examples of the material of such base member include a metal such as Fe, Ni, Cr, Al, Mo, Au, Nb, Ta, V, Ti, Pt or Pb or an alloy thereof, for example a thin plate of brass or stainless steel and a composite material thereof, a film or a sheet of heat-resistant synthetic resin such as polyester, polyethylene, polycarbonate, cellulose acetate, polypropylene, polyvinyl chloride, polyvinylidene chloride, polystyrene, polyamide, polyimide or epoxy resin and a composite material thereof with glass fibers, carbon fibers, boron fibers or metal fibers, such thin metal plate or resin sheet subjected to surface coating of a thin metal film of a different material and/or an insulating film of $SiO_2$, $Si_3N_4$, $Al_2O_3$ or AlN by sputtering, evaporation or plating, glass, and ceramics.

In case of employing the aforementioned base member for that of the solar cell, there is preferably employed a belt-shaped base member. In case such belt-shaped base member is electrically conductive, for example in case of a metal, it may be used directly as the current-collecting electrode. In case such belt-shaped base member is electrically insulating, for example in case of synthetic resin, it is desirable to form, on the surface on which the deposition films are formed, a current-collecting electrode for example of a metal such as Al, Ag, Pt, Au, Ni, Ti, Mo, W, Fe, V, Cr, Cu, stainless steel, brass, nichrome, $SnO_2$, $In_2O_3$, ZnO or ITO or an alloy thereof or a transparent conductive oxide (TCO) by surface treatment such as plating, evaporation or sputtering. Naturally, even in case the belt-shaped base member is electrically conductive, for example in case of a metal, a layer of a different metal or the like may be provided on the surface of the base member on which the deposition films are formed, in order to increase the reflectance for the light of longer wavelength on the base member or to prevent mutual diffusion of constituent elements between the base member and the deposition films.

The surface of the base member can be a smooth surface or a surface having minute irregularities (concave and convex portions). In case of the surface with minute irregularities, the shape of the concave and convex portions is spherical, conical or polygon pyramidal, with a maximum height (Rmax) thereof preferably within a range from 50 to 500 nm thereby causing random light reflection on the surface and increasing the optical path length of the light reflected on the surface. The base member can assume a plate shape, an elongated belt shape or a cylindrical shape of smooth or irregular surface according to the purpose of use. The thickness is suitably determined in order to form a desired photovoltaic device, but is normally selected at least equal to 10 $\mu$m in consideration of the mechanical strength for the ease of producing the base member and of handling.

In the photovoltaic device of the present invention, suitable electrodes are selected according to the configuration of the device. Such electrodes include a lower electrode, an upper electrode (transparent electrode) and a current-collecting electrode (the upper electrode being provided at the light incident side, and the lower electrode being provided opposed to the upper electrode across the semiconductor layers). These electrodes will be detailedly explained in the following.

(Lower Electrode)

The lower electrode 102 to be employed in the present invention is provided between the base member 101 and the n-type semiconductor layer 103. However, in case the base member 101 is electrically conductive, the base member can serve also as the lower electrode. Nevertheless, if the base member 101 is conductive but has a high sheet resistance, there may be provided the electrode 102 as a low resistance electrode for current collection or in order to increase the reflectance on the base member surface, thereby achieving effective utilization of the incident light.

The material for the electrode includes a metal such as Ag, Au, Pt, Ni, Cr, Cu, Al, Ti, Zn, Mo or W or an alloy thereof, and a thin film of such metal is formed for example by vacuum evaporation, electron beam evaporation or sputtering. Also the formed thin metal film has to be so designed as not to constitute a resistance component to the output of the photovoltaic device.

Between the lower electrode 102 and the n-type semiconductor layer 103, there may be provided, though not shown in the drawings, a diffusion preventing layer for example of conductive zinc oxide. Such diffusion preventing layer has the effects not only of preventing diffusion of the metal element constituting the lower electrode 102 into the n-type semiconductor layer but also providing a certain resistance thereby preventing short circuit, resulting from a defect such as a pinhole, between the lower electrode 102 and the transparent electrode 106 positioned across the semiconductor layer, and also generating multiple interference by the thin film, thereby confining the incident light within the photovoltaic device.

(Upper Electrode (Transparent Electrode))

The transparent electrode 106 to be employed in the present invention desirably has a light transmittance of 85% or more in order to achieve efficient absorption of the solar light or the light from a white fluorescent lamp in the semiconductor layer, and also desirably has a sheet resistance of 300 $\Omega/\square$ or less in order not to constitute an electrical resistance component to the output of the photovoltaic device. Examples of the material having such properties include metal oxides such as $SnO_2$, $In_2O_3$, ZnO, CdO, $CdSnO_4$, or ITO ($In_2O_3+SnO_2$), and a thin metal film such as of Au, Al or Cu formed so extremely thin as to be semi-transparent.

The transparent electrode 106 to be superposed on the p-type semiconductor layer 125 in FIG. 1 is preferably composed of a material showing satisfactory mutual adhesion. Such layer can be formed for example by resistance-heated evaporation, electron beam-heated evaporation, sputtering or spraying, to be suitably selected according to the purpose.

(Current-Collecting Electrode)

The current-collecting electrode 107 to be employed in the present invention is provided on the transparent electrode 106 in order to reduce the surface resistance of the transparent electrode 106. Examples of the material of the current-collecting electrode include a thin film of a metal such as Ag, Cr, Ni, Al, Ag, Au, Ti, Pt, Cu, Mo or W or an alloy thereof. Such thin films can be used in superposition. Also the shape and the area of the current-collecting electrode are suitably selected in order to secure a sufficient amount of the incident light to the semiconductor layer.

For example, it desirably has a shape uniformly spread over the light-receiving surface of the photovoltaic device and preferably has an area of 15% or less, more preferably 10% or less, with respect to the light-receiving area. Also the sheet resistance is preferably 50 $\Omega/\square$ or less, more preferably 10 $\Omega/\square$ or less.

(Semiconductor Layer)

The semiconductor layers 103, 104, 105, 113, 114, 115, 123, 124 and 125 are produced by an ordinary thin film forming process such as evaporation, sputtering, high frequency plasma CVD, microwave plasma CVD, ECR, thermal CVD or LPCVD which can be selected arbitrarily. Industrially, there is preferentially employed plasma CVD method in which a raw material gas is decomposed by plasma and is deposited onto the base member.

Also as the reaction apparatus, there can be arbitrarily selected a batch type apparatus or a continuous film forming apparatus. In case of producing a semiconductor controlled in valence electron, there is simultaneously decomposed a gas containing phosphor or boron as the constituent element, such as $PH_3$ or $B_2H_6$.

(i-Type Semiconductor Layer)

For forming the i-type semiconductor layer advantageously employed in the photovoltaic device of the present invention, there can be selected so-called group IV alloy semiconductor materials such as a-SiGe:H, a-SiGe:F, a-SiGe:H:F (wherein "a-" stands for amorphous). Also in a tandem cell structure composed of stacked unit elements, materials for forming i-type semiconductor layers other than amorphous silicon germanium include so-called group IV alloy semiconductor materials such as a-Si:H, a-Si:F, a-Si:H:F, a-SiC:H, a-SiC:F, a-SiC:H:F, μc-Si:H, μc-Si:F, μc-Si:H:F (wherein "μc-" stands for microcrystalline), poly-Si:H, poly-Si:F, poly-SiH:F (wherein "poly-" stands for polycrystalline) and so-called group III–V and II–VI compound semiconductor materials.

The raw material gas to be employed in the CVD method can be linear or cyclic silanes as silicon-containing compounds, and more specifically gaseous or easily gasifiable compounds such as $SiH_4$, $SiF_4$, $(SiF_2)_5$, $(SiF_2)_6$, $(SiF_2)_4$, $Si_2F_6$, $Si_3F_8$, $SiHF_3$, $SiH_2F_2Si_2H_2F_4$, $Si_2H_3F_3$, $SiCl_4$, $(SiCl_2)_5$, $SiBr_4$, $(SiBr_2)_5$, $SiCl_6$, $SiHCl_3$, $SiHBr_2$, $SiH_2Cl_2$ and $SiCl_3F_3$.

Also as germanium-containing compounds, there can be employed linear german or germanium halide, cyclic german or germanium halide, linear or cyclic germanium compound or organic germanium compound having an alkyl radical, and more specifically $GeH_4$, $Ge_2H_6$, $Ge_3H_8$, n-$GeH_{10}$, t-$Ge_4H_{10}$, $GeH_6$, $Ge_5H_{10}$, $GeH_3Cl$, $GeH_2F_2$, $Ge(CH_3)_4$, $Ge(C_2H_5)_4$, $Ge(C_6H_5)_4$, $Ge(CH_3)_2F_2$, $GeF_2$ or $GeF_4$.

(p-Type Semiconductor Layer and n-Type Semiconductor Layer)

The semiconductor material constituting the p-type or n-type semiconductor layer advantageously employed in the photovoltaic device of the present invention can be obtained by doping the semiconductor material constituting the aforementioned i-type semiconductor layer with a valence electron control agent. For its production, there can be employed a method similar to that for producing the aforementioned i-type semiconductor layer. For obtaining a deposited film of group IV of the periodic table, there can be employed a compound containing the element of the group III of the periodic table as the valence electron control agent for obtaining the p-type semiconductor. The element of the group III can be B, and examples of the B-containing compound include $BF_3$, $B_2H_6$, $B_4H_{10}$, $B_5H_9$, $B_5H_{11}$, $B_6H_{10}$, $B(CH_3)_3$, $B(C_2H_5)_3$ and $B_6H_{12}$.

The concentration of p-type impurity is preferably within a range from $1\times10^9$ to $1\times10^{23}$ atom/cm$^3$.

As the valence electron control agent for obtaining n-type semiconductor, there can be employed a compound containing the element of the group V of the periodic table. The element of the group V can be P or N, and examples of the compound containing such element include $N_2$, $NH_3$, $N_2H_5N_3$, $N_2H_4$, $NH_4N_3$, $PH_3$, $P(OCH_3)_3$, $P(OC_2H_5)_3$, $P(C_3H_7)_3$, $P(OC_4H_9)_3$, $P(CH_3)_3$, $P(C_2H_5)_3$, $P(C_3H_7)_3$, $P(C_4H_9)_3$, $P(OCH_3)_3$, $P(OC_2H_5)_3$, $P(OC_3H_7)_3$, $P(OC_4H_9)_3$, $P(SCN)_3$, $P_2H_4$ and $PH_3$.

The concentration of n-type impurity is preferably within a range from $1\times10^{19}$ to $1\times10^{23}$ atom/cm$^3$.

However, at the junction portion between the p-layer and the n-layer in the photovoltaic device, there may result a slight change in the junction state or in the impurity amount or a structural distortion, to generate an increase in the serial resistance and a resulting deterioration in the IV characteristics, thereby significantly affecting the performance.

The present inventor found that the addition of a small amount of nitrogen at the junction portion of the interface of the p-layer and the n-layer facilitates interface control, thereby leading to an improvement in the performance.

The p- and n-layers are formed by utilizing conventional impurities B and P as the valence electron control agents, respectively, and the additional introduction of nitrogen-containing gas (such as $N_2$ or $NH_3$) in such a manner that nitrogen concentration has a peak at the p/n type junction interface portion allows to obtain a concentration distribution having a peak nitrogen concentration within a range from $1\times10^{18}$ to $1\times10^{20}$ atom/cm$^3$. The method of adding nitrogen element in the present invention may be achieved by any other method, and the present invention is by no means limited by such method of addition.

The above-mentioned "interface" means a region in a positional range of up to ±5 nm in the p- and n-layers around the p/n type junction plane.

Figure 6:
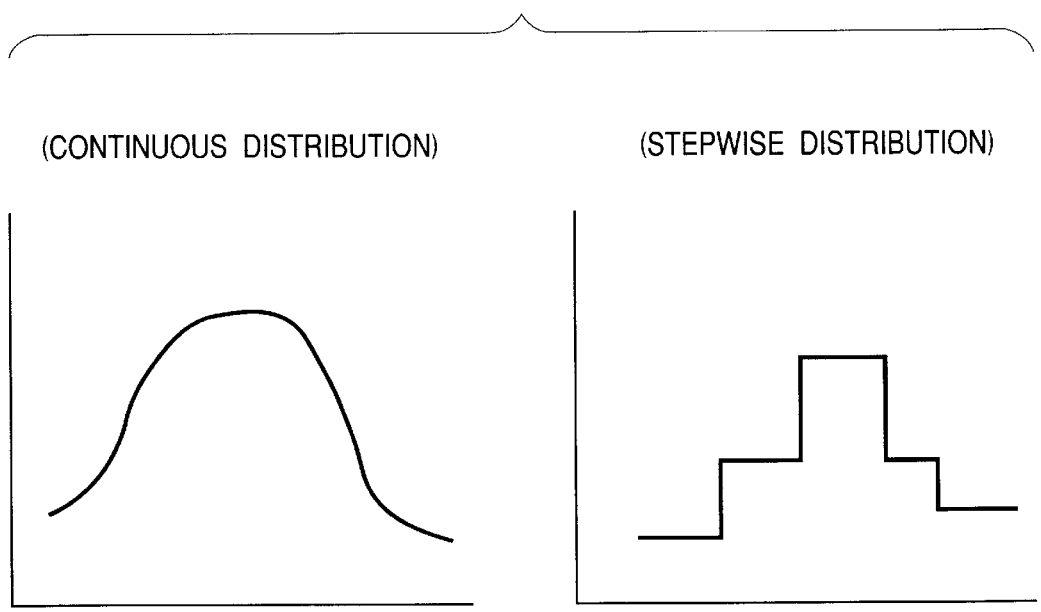
FIG. 6 is a chart showing examples of distribution of the nitrogen concentration at the junction interface between a p-type semiconductor layer and an n-type semiconductor layer employed in the photovoltaic device of the present invention.

The distribution of the nitrogen concentration can be a distribution having the peak at the position of the junction plane ±0 and symmetrical on both sides, or a distribution having a peak in the p- or n-layer side. Also there can be conceived a continuous or stepwise distribution (as shown in FIG. 6).

The effect of the present invention can be exhibited by such control that the peak nitrogen concentration is present at the interface of the junction portion and is within a range from $1\times10^{18}$ to $1\times10^{20}$ atom/cm$^3$. The control of the nitrogen concentration under such condition allows to increase the optical gap at the p/n type junction interface, thereby increasing the short circuit current resulting from a reduced loss in the optical absorption. Also the addition of nitrogen in both p- and n-layers and in the p/n type junction interface is estimated to facilitate formation of an ohmic tunnel junction, thereby enhancing the effect of preventing the increase in the serial resistance component by inverse electromotive force. Also an excessive amount of P or B increases the serial resistance component resulting from a decrease in the photoconductivity, but the addition of nitrogen is considered to widen the control latitude for the flow amount.

Also the addition of nitrogen of a predetermined concentration to the interface relaxes the structural distortion of the interfacial portion, thereby improving the adhesion and stability of the films.

A maximum nitrogen concentration less than $1\times10^{18}$ atom/cm$^3$ cannot sufficiently exhibit the effects of the present invention, and a maximum nitrogen concentration exceeding $1\times10^{20}$ atom/cm$^3$ renders the interfacial structure unstable and adversely affects the electrical and optical characteristics.

When a region outside the aforementioned "interface" portion is defined as a bulk portion, the nitrogen concentration in the bulk portion preferably does not exceed $5\times10^{19}$ atom/cm$^3$ and is lower than the nitrogen concentration of the interface portion.

Also, by so controlling the nitrogen concentration as not to exceed 5% of the concentration of B or P which is the valence electron control agent of the p- or n-layer, there can be further enhanced the effect of preventing the increase in the serial resistance component.

In the following there will be explained examples of the present invention, but the present invention is by no means limited by such examples.

EXAMPLE 1

Figure 5:
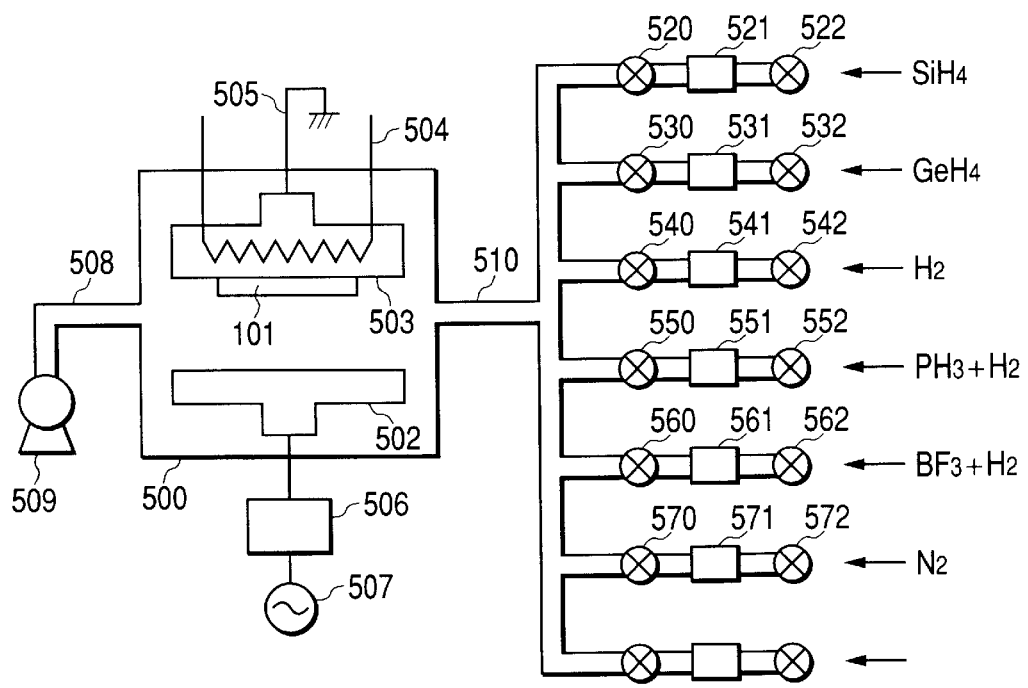
FIG. 5 is a schematic view showing a film forming apparatus suitable for producing the photovoltaic device of the present invention.

A triple cell of the present invention was produced with a CVD film forming apparatus shown in FIG. 5, in which there are shown a reaction chamber 500, a base member 101, an anode 502, a cathode 503, a base member heater 504, a ground terminal 505, a matching box 506, an RF power source 507, an exhaust tube 508, a vacuum pump 509, a film forming gas introducing tube 510, valves 520, 530, 540, 550, 560, 570, 522, 532, 542, 552, 562 and 572, and mass flow controllers 521, 531, 541, 551, 561 and 571.

At first, a stainless steel (SUS304) base member 101 of a size of 5 cm square with mirror-polished surface (0.05 $\mu$m Rmax) was placed in a sputtering apparatus not shown in the drawings, then the interior thereof was evacuated to $10^{-5}$ Pa or less, and Ar gas was introduced to set an internal pressure at 0.6 Pa and DC plasma discharge was induced with a power of 200 W to execute sputtering with an Ag target to deposit Ag by about 500 nm in thickness.

Then the target was changed to ZnO and DC plasma discharge was induced under the same internal pressure and power as the above to deposit ZnO by about 500 nm in thickness.

After the production of the lower electrode 102 through the above-described process, the base member 101 was taken out and mounted on the cathode in the reaction chamber 500, and the interior of the reaction chamber 500 was sufficiently evacuated with the vacuum pump 509 and set to a vacuum level of $10^{-4}$ Pa by an ion gauge not shown in the drawings.

Then the base member 101 was heated to 300° C. with the base member heater 504. After the base member temperature became constant, the valves 520 and 522 were opened and the mass flow controller 521 was so controlled as to introduce $SiH_4$ gas at 30 sccm from an $SiH_4$ container not shown in the drawings into the reaction chamber 500 through the gas introducing tube 510.

The above-mentioned unit "sccm" indicates a flow rate of 1 sccm=1 cm$^3$/min (in normal state) and is hereinafter used for indicating the flow rate.

Similarly the valves 540 and 542 were opened and the mass flow controller 541 was so controlled as to introduce $H_2$ gas at 300 sccm, and the valves 550 and 552 were opened and the mass flow controller 551 was so controlled as to introduce $PH_3$ gas, diluted to 5% with $H_2$ gas, at 10 sccm.

After the internal pressure of the reaction chamber 500 was adjusted to 200 Pa, an electric power of 10 W was introduced from the RF power source 507 through the matching box 506, thereby generating plasma discharge and depositing n-type amorphous silicon layer 103 by 40 nm in thickness.

Then, after the gas supply was terminated, the interior of the reaction chamber 500 was again evacuated to a vacuum level of $10^{-4}$ Pa or lower, and the valves 520, 522, 530, 532, 540 and 542 were opened to introduce $SiH_4$ gas at 30 sccm, $H_2$ gas at 300 sccm and $GeH_4$ gas at 5.0 sccm into the reaction chamber 500. Then an electric power of 20 W was applied from the RF power source 507 to generate plasma discharge, thereby depositing an i-type amorphous silicon-germanium layer 104 of a thickness of about 180 nm.

Then the mass flow controllers were changed to a flow rate of 0 sccm, and the valves 520, 522, 530, 532, 540 and 542 were closed to instantly change the flow rates of $GeH_4$, $SiH_4$ and $H_2$ gasses to 0 sccm. After the RF power was shifted to 0 W to terminate plasma discharge and the gas supply was terminated, the interior of the reaction chamber 500 was evacuated to a vacuum level of $10^{-4}$ Pa or lower and the valves 520, 522, 540, 542, 560 and 562 were opened to introduce $SiH_4$ gas at 1 sccm, $H_2$ gas at 300 sccm and $BF_3$ gas, diluted to 5% with $H_2$ gas, at 10 sccm into the reaction chamber 500.

Then an electric power of 20 W was applied from the RF power source 507 to generate plasma discharge, thereby depositing a p-layer 105 by 10 nm in thickness to form the bottom layer. From a specimen of the p-layer deposited under the aforementioned conditions on a glass base member, a microcrystalline state with a grain size of 2 to 10 nm was confirmed by cross-sectional observation under a transmissive electron microscope (TEM).

Then, after an n-layer 113 was deposited as explained in the foregoing, an i-layer 114 was deposited by 100 nm in the same method as explained in the foregoing, except that the flow rate of $GeH_4$ gas was changed to 2.5 sccm.

Then a p-layer 115 was deposited in the above-described method, but, in the course of film formation, the valves 570 and 572 were opened and the mass flow controller 571 was controlled to introduce $N_2$ gas in such a manner that the nitrogen concentration gradually increases toward the interface with the n-layer to be formed next, thereby forming the middle layer.

Then, during the deposition of an n-layer 123, the valves 570 and 572 were opened in addition to the aforementioned conditions and the mass flow controller 571 was controlled to introduce $N_2$ gas.

In this operation, the $N_2$ gas flow rate was so controlled that the nitrogen concentration is continuous with the nitrogen concentration in the middle p-layer and has a peak in the vicinity of the interface and then gradually decreases.

Then $SiH_4$ gas at 30 sccm and $H_2$ gas at 300 sccm were introduced and an electric power of 20 W was applied to deposite an amorphous i-type silicon layer 124 by 70 nm in thickness, and a p-layer 125 was deposited to complete the top layer.

After cooling the base member, the base member 101 was taken out from the reaction chamber 500 and was charged in a resistance-heated evaporation apparatus not shown in the drawings. After the interior of the apparatus was evacuated to $10^{-5}$ Pa or lower, oxygen gas was introduced to an internal pressure of 50 Pa and an In—Sn alloy was evaporated by resistance heating, thereby depositing a transparent conductive film (ITO film), having also an antireflective function, by 70 nm in thickness to form the upper electrode 106.

After the evaporation, the sample was taken out and separated by a dry etching apparatus not shown in the drawings into sub cells of a size of 1×1 cm, and was transferred to another evaporation apparatus to form an aluminum current-collecting electrode 107 by electron beam evaporation. The obtained solar cell was named as No. 1-1.

Also samples Nos. 1-2, 1-3, 1-4 and 1-5 were prepared by executing film formation in the same manner as explained in the foregoing except that the $N_2$ gas flow rate was changed in the middle p-layer and the top n-layer.

These samples were irradiated in a solar simulator with light of solar spectrum AM-1.5 and with an intensity of 100 mW/cm$^2$, and the initial conversion efficiency of the solar cell was measured by determining the IV curve.

Figure 2:
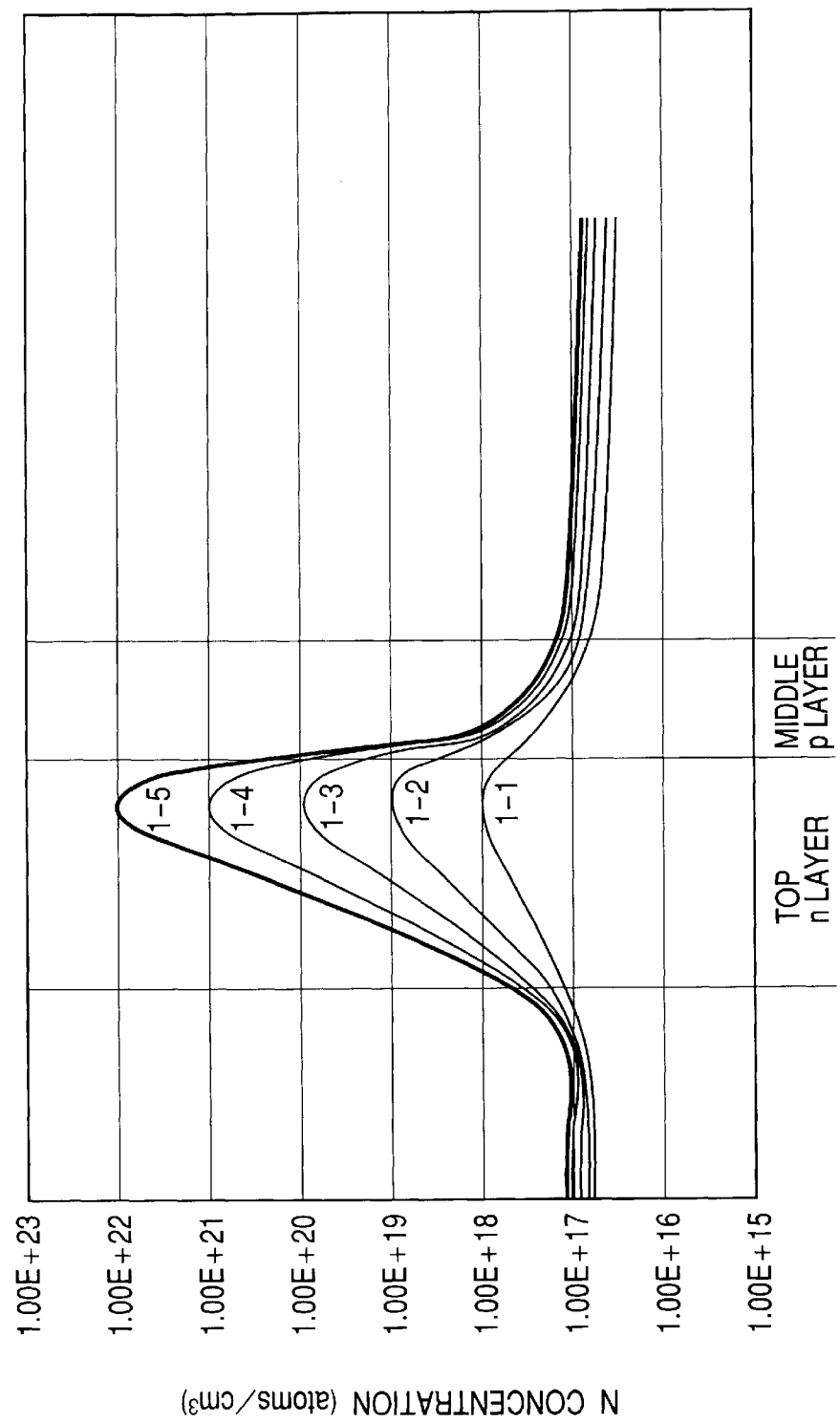
FIG. 2 is a graph showing the nitrogen concentrations in a top n-layer and a middle p-layer in a triple cell.
Figure 3:
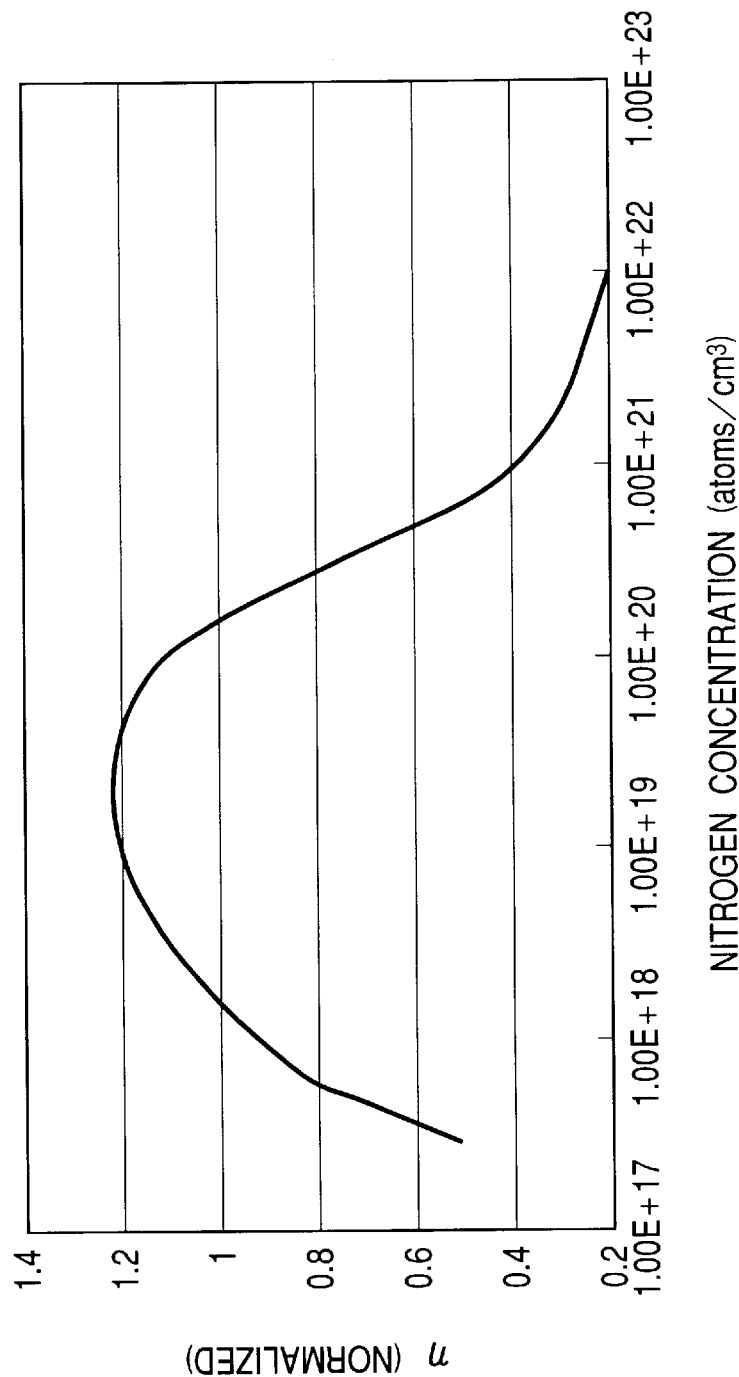
FIG. 3 is a graph showing the relationship between the maximum nitrogen concentration in the top n-layer of a triple cell and the initial conversion efficiency thereof.

The obtained results are shown in FIGS. 2 and 3. FIG. 2 shows the nitrogen concentration in the top n-layer and middle p-layer in each sample, and confirms that the nitrogen concentration has a peak in the vicinity of the p/n junction plane of the top n-layer. FIG. 3 shows the initial conversion efficiency η as a function of the maximum nitrogen concentration in the top n-layer in each sample in the abscissa. The initial conversion efficiency η (normalized) is normalized by taking the conversion efficiency of the sample 1-1 as unity.

These results indicate that the optimum nitrogen concentration at the p/n type junction interface is within a range of $1\times10^{18}$ to $1\times10^{20}$ atom/cm$^3$.

EXAMPLE 2

Triple cells were produced in the same manner as in Example 1 by the film forming apparatus shown in FIG. 5. However, the N$_2$ gas supply in the middle p-layer and top n-layer was varied within a range smaller than in Example 1 to obtain samples 2-1, 2-2, 2-3, 2-4 and 2-5.

In any of these samples, the peak nitrogen concentration was at the p/n type junction interface and within a range of $1\times10^{18}$ to $1\times10^{20}$ atom/cm$^3$.

Figure 4:
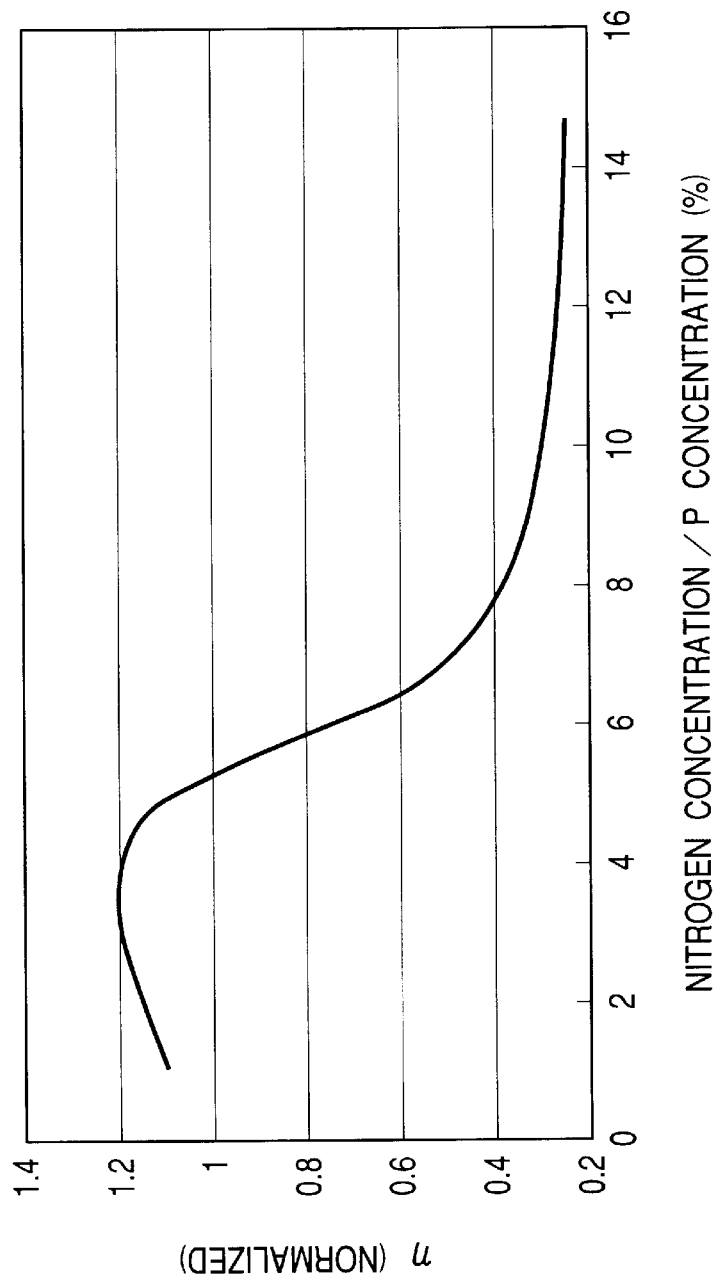
FIG. 4 is a graph showing the relationship between the nitrogen concentration relative to P concentration in the top n-layer of a triple cell and the initial conversion efficiency thereof.

These samples were subjected to the measurement of the initial conversion efficiency as in Example 1, and the obtained results are shown in FIG. 4, in which the initial conversion efficiency η is indicated on the ordinate as a function of the percentage of the peak nitrogen concentration relative to P concentration in the top p-layer of each sample in the abscissa. The abscissa indicates the proportion of the peak nitrogen concentration to the P concentration. The initial conversion efficiency η (normalized) is normalized by taking the conversion efficiency of the sample 2-1 as unity.

These results indicate that the initial conversion efficiency has a maximum peak within a range of the nitrogen concentration being about 3 to 5% of the P concentration, and that the proportion of the nitrogen concentration to the P concentration not exceeding 5% is suitable for production of a solar cell.

EXAMPLE 3

Then samples were prepared in such a manner that the peak nitrogen concentration was positioned at the side of the middle p-layer with respect to the p/n junction interface, and the nitrogen concentration was varied as in Example 2 to investigate the relationship of the nitrogen concentration relative to B concentration and the initial conversion efficiency (results is not shown in the drawings).

The obtained results were similar to those of Example 2, indicating that the initial conversion efficiency has a maximum peak within a range of the nitrogen concentration being about 3 to 5% of the P concentration, and that the proportion of the nitrogen concentration to the P concentration not exceeding 5% is suitable for the production of a solar cell.

The preferred embodiments of the present invention provide the following effects.

An improvement in the interface characteristics provides a photovoltaic device having a high photoelectric conversion efficiency, and a photovoltaic device with excellent interface matching and with structural stability (adhesion of films).

Also an increase in the optical gap at the p/n type junction interface reduces the loss in the light absorption, thereby leading to an increase in the short circuit current.

Since the short circuit current (Jsc) is improved and microcrystalline silicon has a wider band gap in comparison with amorphous silicon, the efficiency of impurity addition becomes high and the internal electric field in the photovoltaic device increases. As a result, the open-circuit voltage (Voc) is also improved and the photoelectric conversion efficiency is improved.

Also among the electron-hole pairs generated by the incident light, the positive holes having shorter diffusion distance become easier to collect, whereby the comprehensive collection efficiency of light is improved.

Also the conversion efficiency is improved by stacking the elements of different band gaps and efficiently absorbing each portion of the solar light spectrum.

In this manner there can be obtained a photovoltaic device with a further improved photoelectric conversion efficiency.

What is claimed is:

1. A photovoltaic device comprising a plurality of unit elements stacked mutually while forming a p/n junction, each of the unit elements having a pn or pin structure composed of a silicon-based non-single-crystalline semiconductor material, wherein a nitrogen concentration has a maximum peak at a junction interface of the p/n junction, and the nitrogen concentration at the maximum peak as a peak nitrogen concentration is within a range from $1\times10^{18}$ atom/cm$^3$ to $1\times10^{20}$ atom/cm$^3$.

2. A photovoltaic device according to claim 1, wherein an n-layer at the p/n junction contains an n-type impurity, and the peak nitrogen concentration does not exceed 5% of the concentration of the n-type impurity.

3. A photovoltaic device according to claim 2, wherein the n-type impurity is phosphor element.

4. A photovoltaic device according to claim 1, wherein a p-layer at the p/n junction contains a p-type impurity and the peak nitrogen concentration does not exceed 5% of the concentration of the p-type impurity.

5. A photovoltaic device according to claim 4, wherein the p-type impurity is boron element.

6. A photovoltaic device according to claim 1, wherein the nitrogen concentration changes in the junction interface within a range from $1\times10^{18}$ atom/cm$^3$ to $1\times10^{20}$ atom/cm$^3$.

7. A photovoltaic device according to claim 1, wherein the p-layer at the p/n junction is composed of hydrogenated microcrystalline silicon.

8. A photovoltaic device according to claim 1, wherein the p-layer at the p/n junction is provided at the light incident side.

9. A photovoltaic device according to claim 1, wherein the plurality of unit elements have different band gaps, and in comparison with a band gap of a unit element provided at the light incident side, the band gap of a unit element positioned thereunder is narrower.

10. A photovoltaic device according to claim 1, wherein two or more p/n junctions are provided, and the nitrogen concentration has a maximum peak at the junction interface of a p/n junction at least on the light incident side, and the nitrogen concentration at the maximum peak as a peak nitrogen concentration is within a range from $1\times10^{18}$ atom/cm$^3$ to $1\times10^{20}$ atom/cm$^3$.

* * * * *

UNITED STATES PATENT AND TRADEMARK OFFICE
CERTIFICATE OF CORRECTION

PATENT NO. : 6,700,057 B2
DATED : March 2, 2004
INVENTOR(S) : Atsushi Yasuno

It is certified that error appears in the above-identified patent and that said Letters Patent is hereby corrected as shown below:

Column 5,
Line 6, "Also" should read -- ¶ Also --.
Line 31, "SiH$_2$F$_2$Si$_2$H$_2$F$_4$," should read -- SiH$_2$F$_2$, Si$_2$H$_2$F$_4$, --.
Line 60, "1x10$^9$" should read -- 1x10$^{19}$ --.

Signed and Sealed this

Fourteenth Day of September, 2004

JON W. DUDAS
*Director of the United States Patent and Trademark Office*